United States Patent
Muroyama

(10) Patent No.: US 6,169,023 B1
(45) Date of Patent: Jan. 2, 2001

(54) METHOD FOR MAKING SEMICONDUCTOR DEVICE

(75) Inventor: Masakazu Muroyama, Kanagawa (JP)

(73) Assignee: Sony Corporation

( * ) Notice: Under 35 U.S.C. 154(b), the term of this patent shall be extended for 0 days.

(21) Appl. No.: 08/911,551

(22) Filed: Aug. 14, 1997

Related U.S. Application Data

(63) Continuation of application No. 08/570,653, filed on Dec. 11, 1995, now Pat. No. 5,700,736.

(30) Foreign Application Priority Data

Dec. 13, 1994 (JP) ...................................... 6-332603

(51) Int. Cl.$^7$ ................................................. H01L 21/4763
(52) U.S. Cl. ......................... 438/623; 438/784; 438/789; 427/255.29
(58) Field of Search ................................. 438/784, 763, 438/789, 790, 623; 427/255.3, 255.29

(56) References Cited

U.S. PATENT DOCUMENTS

| | | | |
|---|---|---|---|
| 5,215,787 | * | 6/1993 | Homma . |
| 5,288,518 | | 2/1994 | Homma . |
| 5,334,552 | * | 8/1994 | Homma . |
| 5,420,075 | | 5/1995 | Homma et al. . |
| 5,492,736 | * | 2/1996 | Laxman et al. ...................... 427/579 |
| 5,700,736 | | 12/1997 | Muroyama . |
| 5,807,785 | * | 9/1998 | Ravi ..................... 438/624 |
| 5,827,785 | * | 10/1998 | Bhan et al. ......................... 438/784 |
| 5,876,798 | * | 3/1999 | Vassiliev ............................ 427/255.3 |
| 5,908,672 | * | 6/1999 | Ryu et al. ............................ 427/574 |

FOREIGN PATENT DOCUMENTS

517548A2 * 12/1992 (EP) .

* cited by examiner

Primary Examiner—Caridad Everhart
(74) Attorney, Agent, or Firm—Sonnenschein, Nath & Rosenthal

(57) ABSTRACT

An SiOF layer is formed by using as raw material an organic Si compound having Si—F bonds. Since an organic Si compound is used as raw material, an intermediate product being formed during the formation of an SiOF layer is liable to polymerize and has fluidity. Moreover, since the organic Si compound has Si—F bonds, low in bond energy, and is thus capable of easily getting only Si—F bonds separated, the SiOF layer is prevented from getting contaminated by reaction by-products and fluorine can be introduced into the SiOF layer in stable fashion. Therefore, an insulator layer, low in dielectric constant, low in hygroscopicity and excellent in step coverage, can be formed by using a low powered apparatus.

10 Claims, 2 Drawing Sheets

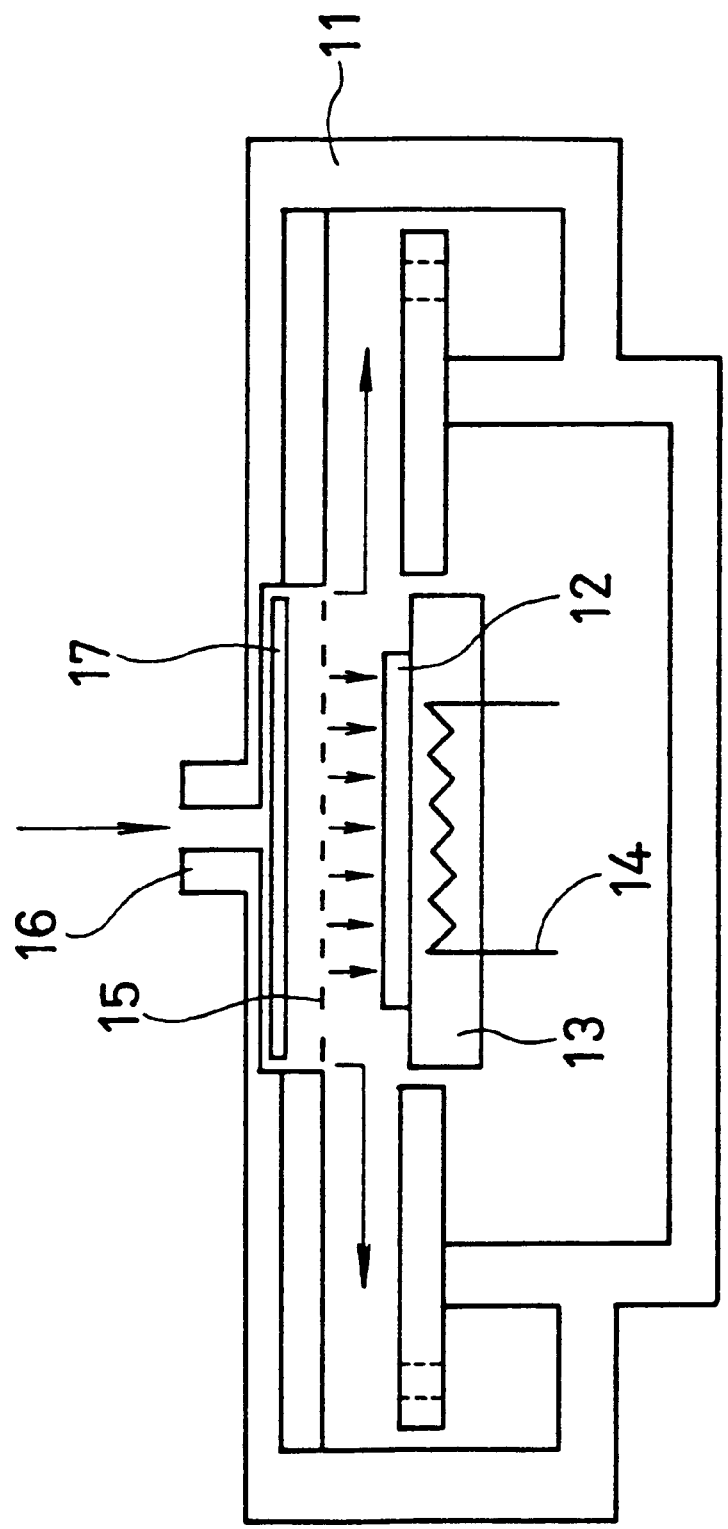

METHOD FOR MAKING SEMICONDUCTOR DEVICE

This is a continuation of application Ser. No. 08/570,653, filed Dec. 11, 1995, now U.S. Pat. No. 5,700,736.

BACKGROUND OF THE INVENTION

1. Field of the Invention

The present invention relates to a method for making a semiconductor device having an insulator layer for isolating conductive layers from each other.

2. Description of the Related Art

In a semiconductor device, conductive layers of different layers or of same layer are insulated from each other by being covered with an insulator layer. With ever-increasing miniaturization of design rule of a semiconductor device, however, there has become problematic a delay in operation due to parasitic capacitance originating from an insulator layer together with a semiconductor layer insulated by that insulator layer. Thus, need for an insulator layer having low dielectric constant is growing in order to effectively suppress an increase in capacitance even when the layer thickness is made smaller.

As methods for forming an insulator layer having low dielectric constant, there have been known a method for forming an SiOF layer using TEOS with addition of $C_2F_6$ as fluorine source (25th SSDM'93, p. 161) and a method for forming an SiOF layer using TEOS with addition of $NF_3$ as fluorine source (40th United Lecture Conference related to Applied Physics, Preprint, 1a-ZV-9).

According to the above-mentioned conventional methods, however, decomposition energy of $C_2F_6$ or $NF_3$ is approximately equal to that of the alkyl groups in TEOS.

This leads to contamination of the SiOF layer by reaction by-products. Introduction in stable fashion of fluorine into the SiOF layer also meets difficulty here. For this reason, with increasing amount of fluorine included in the SiOF layer, layer quality of the SiOF layer markedly worsens. This leads to higher hygroscopicity of the SiOF layer, resulting in a decrease in the reliability of a semiconductor device.

In order to form an SiOF layer having an excellent layer quality, there has been proposed a method for forming an SiOF layer using an $SiF_4/O_2$ type gas that contains fluorine in the raw material gas structure (40th United Lecture Conference related to Applied Physics, Preprint, 31p-ZV-1).

However, since the $SiF_4/O_2$ type gas is relatively difficult to decompose, a high density plasma CVD apparatus is required in order to form an SiOF layer by using this gas. In other words, a new type plasma CVD apparatus, different from the conventional one, is required here. According to this conventional method, it is difficult to manufacture with ease a semiconductor device that is fast in operation and high in reliability.

SUMMARY OF THE INVENTION

A method for making a semiconductor device according to a first invention of the present invention is characterized in that an insulator layer is formed by using as raw material an organic Si compound having Si—F bonds.

Among others, the above organic Si compound is preferably a compound having a chain or cyclic structure.

Preferable examples of the above organic Si compound having a chain or cyclic structure are: fluoroalkoxysilane ($F_xR_ySi$; $x+y=4$, $x \geq 1$; R:hydrogen, alkoxy or alkyl group), chain polysilane ($F_xR_ySi$—O—$SiR_mF_n$; $x+y=4$, $m+n=4$, $x$, $n \geq 1$; R:hydrogen, alkoxy or alkyl group), cyclic polysilane $\{(F_xR_y)_4SiO_4$; $x+y=4$, $x$, $y >1$; R:hydrogen, alkoxy or alkyl group$\}$ and higher fluorosilane $\{f(F_xR_y)_{2m+2}Si_m$; $x+y=4$, $x$, $m >1$; R:hydrogen, alkoxy or alkyl group$\}$.

In a method for making a semiconductor device according to the present invention, the above insulator layer is preferably formed by a plasma CVD method using as raw material gas the above organic Si compound.

A method for making a semiconductor device according to a second invention of the present invention is characterized in that the above insulator layer is formed by repeating more than once by turns a step of adsorption of a raw material gas comprising the above organic Si compound by a substrate on which the above insulator layer is to be formed and a step of removal of unreacted matters from the adsorption layer by plasma treatment.

BRIEF DESCRIPTION OF THE DRAWINGS

FIG. 2 is a concept representation of a CVD apparatus used in the first to third embodiments of the present invention.

DETAILED DESCRIPTION OF THE PREFERRED EMBODIMENTS

Figure 1A:
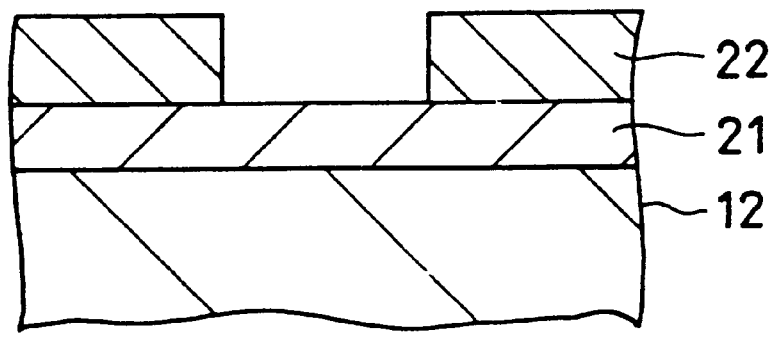
FIGS. 1A and 1B are sectional side views of a semiconductor device, showing first to third embodiments of the present invention in sequence of processing steps.

In the method for making a semiconductor device, according to the first invention of the present invention, an insulator layer is formed by using as raw material an organic Si compound. Since an intermediate product being formed during the formation of the insulator layer is liable to polymerize and has fluidity, the insulator layer thus formed is excellent in step coverage.

Moreover, since the organic Si compound has Si—F bonds, whose bond energy is higher than that of C—O bond of an alkoxy group, separation solely of alkoxy groups from an organic Si compound can be easily effected. Therefore, the insulator layer formed is prevented from getting contaminated by reaction by-products and fluorine can be introduced into the insulator layer in stable fashion. Thus, an insulator layer, excellent in layer quality despite its low dielectric constant and low in hygroscopicity, can be formed by using a low powered apparatus.

Since the insulator layer can be formed at relatively low temperature by using plasma CVD method, no damage is inflicted on existing Al wirings.

In the method for making a semiconductor device according to the second invention of the present invention, probability is low of the reaction between the surface of the insulator layer being formed and the molecules of the raw material gas. Moreover, there is formed a liquefied layer of the molecules of the raw material gas so that this layer has fluidity. These altogether lead to a formation of an insulator layer further improved in step coverage. On the other hand, unreacted matters are removed from the adsorption layer by the plasma treatment after the adsorption so that an insulator layer is formed with further improved layer quality and further reduced hygroscopicity, without that the step coverage is negatively affected.

In the following referring to FIGS. 1 and 2, there will be explained first to third embodiments of the present invention which is applied to making a semiconductor device having as interlayer insulator an SiOF layer.

Prior to an explanation of the embodiments, there will be made an explanation of a parallel plate type plasma CVD apparatus that is used for forming the SiOF layer in the first to third embodiments. In this CVD apparatus as indicated in FIG. 2, out of parallel plate electrodes located in a reaction chamber 11, a lower electrode 13, on which a semiconductor substrate 12 is placed and which is grounded, is either heated or cooled by a heater/cooler 14 such that the treatment is carried out at lowest possible temperature in order not to cause a deterioration in the layer quality.

On the other hand, an upper electrode 15, to which an RF voltage is applied, is formed as a shower electrode;

as indicated with an arrow in FIG. 2, a gas dispersing plate 17 is placed between the upper electrode 15 and a gas inlet pipe 16 in order to uniformly disperse in the reaction chamber 11 both a raw material gas to form the SiOF layer and a plasma treatment gas.

Figure 1B:
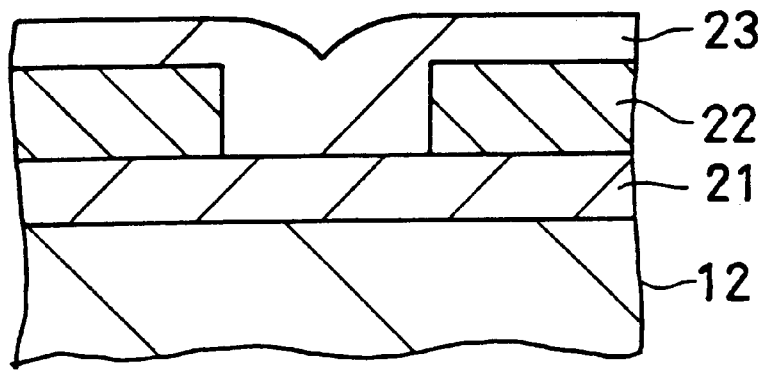

Next, the first embodiment will be explained. In the first embodiment, as shown in FIG. 1A, an interlayer insulator 21 such as an $SiO_2$ layer or the like is formed on the semiconductor substrate 12 such as an Si substrate or the like, and Al wirings 22 are patterned on the interlayer insulator 21. Thereafter, by using a CVD apparatus shown in FIG. 2 and using as the raw material gas difluoro-diethoxysilane that is an organic Si compound having Si—F bonds, an SiOF layer 23 is formed as shown in FIG. 1B under the following condition:

| | |
|---|---|
| Flow rate of $F_2(C_2H_5O)_2Si$ gas | 200 sccm |
| Flow rate of $O_2$ | 200 sccm |
| Pressure | 1200 Pa |
| Temperature of the semiconductor substrate | 300° C. |

Thereafter, the SiOF layer 23 is annealed in a forming gas whose $H_2$ concentration was reduced to 3% by dilution with $N_2$, under the following condition:

| | |
|---|---|
| Flow rate of the forming gas | 8 liters/minute |
| Annealing time | 60 minutes |
| Pressure | atmospheric pressure |
| Annealing temperature | 400° C. |

In the first embodiment as illustrated so far, difference in bond energy is large between C—O bond and Si—F bond in $F_2(C_2H_5O)_2Si$ gas. It is therefore possible to selectively break $C2H_5O$ between C and O by regulating RF power of the plasma CVD apparatus. In this way, not only a SiOF layer 23 thus formed is prevented from getting contaminated by reaction by-products but also an excellent SiOF layer 23 in layer quality(see below) can be formed by introduction in stable fashion of fluorine into that SiOF layer 23.

Corrosion tests are carried out in a hydrochloric acid solution under the following condition:
Concentration of the hydrochloric acid solution: 5%
Test duration: 5 minutes
Temperature of the hydrochloric acid solution: 25° C.
No corrosion of the Al wirings 22 is observed. This can be understood as an indication that the layer quality of the SiOF layer 23 is excellent and that, as shown in FIG. 1B, the step portions of the Al wirings 22 are sufficiently X covered by the SiOF layer 23.

Next, the second embodiment will be explained. The second embodiment also follows essentially the same processing steps as in the above first embodiment except that the SiOF layer 23 is formed under the condition described below; in the second embodiment, there is used as raw material gas 2,4,6,8-tetrafluoro, 2,4,6,8-tetramethoxy type one that is a cyclic polysilane which is supposed to be able to bring about a very excellent step coverage:

| | |
|---|---|
| Flow rate of $SiF_4(OC_2H_5)O_4$ gas | 300 sccm |
| Flow rate of $O_2$ | 100 sccm |
| Pressure | 1200 Pa |
| Temperature of the semiconductor substrate | 300° C. |

After the SiOF layer 23 has been formed, corrosion tests are carried out under the same condition as in the first embodiment. No corrosion of the Al wirings 22 is observed in this second embodiment, too.

Next, the third embodiment will be explained. The third embodiment also follows essentially the same processing steps as in the above first embodiment except for the forming step of the SiOF layer 23. That is, in the third embodiment, both the adsorption of the raw material gas and the removal of unreacted matters in the adsorption layer by the plasma treatment are repeated ten times by turns under the following condition, respectively:

| The adsorption of the raw material gas: | |
|---|---|
| Flow rate of $F_2(C_2H_5O)_2Si_2O$ gas | 200 sccm |
| Pressure | 1200 Pa |
| Temperature of the semiconductor substrate | 50° C. |
| Adsorption time | 30 sec |
| The plasma treatment: | |
| Flow rate of $O_2$ gas | 200 sccm |
| Pressure | 1200 Pa |
| RF power | 500 W |
| Temperature of the semiconductor substrate | 400° C. |
| Treatment duration | 30 sec |

After the SiOF layer 23 has been formed, corrosion tests are carried out under the same condition as in the first embodiment. No corrosion of the Al wirings 22 is observed in this third embodiment, too.

Conclusively, by the method for making a semiconductor device according to the first invention of the present invention, an insulator layer, low in dielectric constant, low in hygroscopicity and excellent in step coverage can be formed by using a low powered apparatus. Therefore, there can easily be made a semiconductor device less in delay in operation due to parasitic capacitances and thus fast in operation, and of high reliability.

By the method for making a semiconductor device according to the second invention of the present invention, an insulator layer, still more excellent in step coverage and still less in hygroscopicity, can be formed. Thus, a still more reliable semiconductor device can be made.

What is claimed is:
1. A method for making a semiconductor device comprising the steps, of:
 forming a first wiring layer on a substrate;
 forming an insulator layer on said first wiring layer by plasma chemical vapor deposition methods using a raw material gas consisting of an organic Si compound having Si—F bonds alone or in combination with $O_2$, wherein the step of forming said insulator layer is performed in a chemical vapor deposition apparatus at a substrate temperature of about 300° C. and at a pressure of about 1200 Pa; and forming a second wiring layer on said insulator layer.

2. A method for making a semiconductor device according to claim 1, wherein said insulator layer comprises SiOF.

3. A method for making a semiconductor device according to claim 1, wherein said organic Si compound is selected from the group consisting of:

a fluoroalkoxysilane of the formula, wherein x+y=4, x≧1 and R is a hydrogen, alkoxy or alkyl group, and at least one of said R groups being an alkoxy or an alkyl group;

a chain polysilane of the formula, wherein x+y=4, m+n=4, x, n ≧1 and R is a hydrogen, alkoxy or alkyl group, and at least one of said R groups being an alkoxy or an alkyl group;

a cyclic polysiloxane of the formula $(F_xR_y)_4(SiO)_4$, wherein x+y=4 and x and y are each ≧1, and R is a hydrogen, alkoxy or alkyl group and at least one of said R groups being an alkoxy or an alkyl group; and a higher fluorosilane of the formula $(F_xR_y)_{2m+2}Si_m$, wherein x+y=4, and x and m are each ≧1 and R is a hydrogen, alkoxy or alkyl group and at least one of said R groups being an alkoxy an alkyl group.

4. A method as defined in claim 1, wherein the substrate comprises an Si substrate having a surface and an $SiO_2$ layer disposed on said surface.

5. A method as defined in claim 1, wherein said first wiring layer comprises Al wirings.

6. A method as defined in claim 1, further comprising the step of annealing the insulator layer in a forming gas of $H_2$ and $N_2$ at atmospheric pressure, at a temperature of about 400° C. for a period of about 60 minutes.

7. A method as defined in claim 1, wherein the raw material gas consists of $F_2(C_2H_5O)_2Si$ and $O_2$.

8. A method as defined in claim 1, wherein the raw material gas consists of 2,4,6,8,-tetrafluoro-2,4,6,8-tetraethoxy-cyclic tetrasiloxane and $O_2$.

9. A method as defined in claim 1, wherein the raw material gas consists of $F_2(C_2H_5O)_2Si_2O$.

10. A method for making a semiconductor device comprising the steps of:

forming a first wiring layer on a substrate;

forming an insulator layer on said first wiring layer by plasma chemical vapor deposition methods using a raw material gas consisting of an organic Si compound having Si—F bonds alone or in combination with $O_2$ wherein the step of forming said insulator layer is performed in a chemical vapor deposition apparatus at a substrate temperature of about 50° C. and at a pressure of about 1200 Pa; and forming a second wiring layer on said insulator layer.

* * * * *